(12) United States Patent
Gu

(10) Patent No.: US 12,323,156 B2
(45) Date of Patent: Jun. 3, 2025

(54) CLOCK SIGNAL GENERATION CIRCUIT

(71) Applicant: Realtek Semiconductor Corp., HsinChu (TW)

(72) Inventor: LiJun Gu, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 337 days.

(21) Appl. No.: 17/968,791

(22) Filed: Oct. 18, 2022

(65) Prior Publication Data

US 2023/0140495 A1 May 4, 2023

(30) Foreign Application Priority Data

Oct. 29, 2021 (CN) .......................... 202111275517.8

(51) Int. Cl.
*H03L 7/22* (2006.01)
*G06F 1/12* (2006.01)
*G11C 7/22* (2006.01)
*H03L 7/08* (2006.01)

(52) U.S. Cl.
CPC .................. *H03L 7/22* (2013.01); *G06F 1/12* (2013.01); *G11C 7/222* (2013.01); *H03L 7/08* (2013.01)

(58) Field of Classification Search
CPC ... H03L 7/08; H03L 7/22; G11C 7/222; G06F 1/04; G06F 1/06; G06F 1/10; G06F 1/12
See application file for complete search history.

(56) References Cited

U.S. PATENT DOCUMENTS

| | | | |
|---|---|---|---|
| 6,380,774 B2 | 4/2002 | Saeki | |
| 9,698,797 B1* | 7/2017 | Gulati | ...................... H03L 7/23 |
| 10,241,538 B2* | 3/2019 | Chang | .................... G11C 7/222 |
| 10,911,037 B2 | 2/2021 | Tee | |
| 2003/0197537 A1* | 10/2003 | Saint-Laurent | ....... H03L 7/0816 327/165 |
| 2019/0346877 A1* | 11/2019 | Allan | .................... H03L 7/1976 |

FOREIGN PATENT DOCUMENTS

TW    I592788 B    7/2017

* cited by examiner

*Primary Examiner* — Patrick O Neill
(74) *Attorney, Agent, or Firm* — Winston Hsu

(57) ABSTRACT

The present invention provides a clock signal generation circuit including a global PLL and a plurality of local PLLs. In the operation of the clock signal generation circuit, the global PLL is configured to receives a reference clock signal to generate a synchronization clock signal, and the plurality of local PLLs receive the synchronization clock signal to generate a plurality of clock signals, respectively, and the plurality of clock signals are used to generate a plurality of output clock signals.

8 Claims, 4 Drawing Sheets

CLOCK SIGNAL GENERATION CIRCUIT

BACKGROUND OF THE INVENTION

1. Field of the Invention

The present invention relates to a clock signal generation circuit, and more particularly, to a clock signal generation circuit capable of generating a plurality of clock signals.

2. Description of the Prior Art

In a physical layer circuit of the current double data rate (DDR) dynamic random access memory (DRAM), a phase-locked loop (PLL) is designed to generate an output clock signal, and the output clock signal then passes through a plurality of phase interpolators or a plurality of delay-locked loops (DLL) to generate multiple clock signals required for data signals (DQ), data strobe signal (DQS), command signal (CMD), address signal (ADD), double data rate clock signal (DDRCK), receiver clock signal (CK_RX), etc. The above structure allows the multiple clock signals to be independently phase-adjusted, and easily achieves synchronization of the multiple clock signals.

However, the above structure has the following disadvantages: (1) when a number of bits of the data signals (DQ) is large, such as 32 bits, the clock tree will have a longer length in the circuit layout, therefore, additional clock jitters will be introduced, and these clock jitters cannot be filtered out; (2) the current DRAM usually has a dynamic frequency scaling (DFS) mechanism to save power consumption, however, the settling time required for dynamic frequency adjustment is very short, and the phase-locked loop is usually not designed with high bandwidth to ensure its stability, so it is difficult to achieve fast dynamic frequency adjustment for arbitrary frequency.

SUMMARY OF THE INVENTION

It is therefore an objective of the present invention to provide a clock signal generation circuit, which can generate a plurality of clock signals whose phases can be adjusted independently, to solve the problem that the clock tree in the prior art is too long and it is difficult to achieve fast dynamic frequency adjustment for arbitrary frequency.

According to one embodiment of the present invention, a clock signal generation circuit comprising a global PLL and a plurality of local PLLs is disclosed. In the operation of the clock signal generation circuit, the global PLL is configured to receives a reference clock signal to generate a synchronization clock signal, and the plurality of local PLLs receive the synchronization clock signal to generate a plurality of clock signals, respectively, and the plurality of clock signals are used to generate a plurality of output clock signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
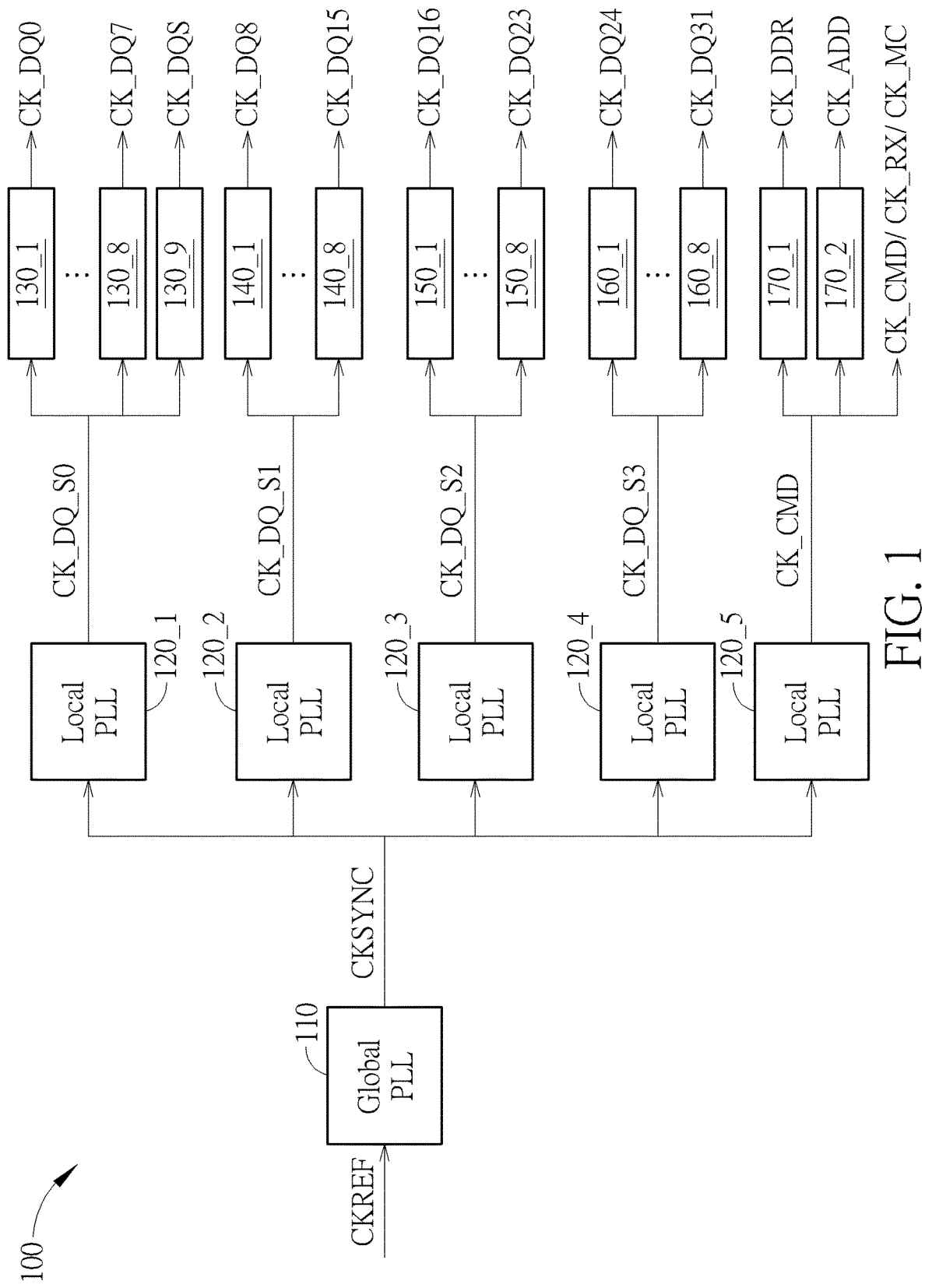
FIG. 1 is a diagram illustrating a clock signal generation circuit according to one embodiment of the present invention.

FIG. 1 is a diagram illustrating a clock signal generation circuit 100 according to one embodiment of the present invention. As shown in FIG. 1, the clock signal generation circuit 100 comprises a global PLL 110, a plurality of local PLLs and a plurality of phase adjustment circuits 130_1-130_9, 140_1-140_8, 150_1-150_8, 160_1-160_8, 170_1 and 170_2. In this embodiment, the clock signal generation circuit 100 is applied to a physical layer circuit of a DRAM controller that generates 32-bit data signals, and the clock signal generation circuit 100 is used to generate a plurality of clock signals required for data signals (DQ), data strobe signal (DQS), command signal (CMD), address signal (ADD), double data rate clock signal (DDRCK), receiver clock signal (CK_RX), etc. In this embodiment, the phase adjustment circuits 130_1-130_9, 140_1-140_8, 150_1-150_8, 160_1-160_8, 170_1 and 170_2 can be implemented by phase interpolators, and there are five local PLLs 120_1-120_5 within the clock signal generation circuit 100, however, these designs are only used as examples to illustrate, not a limitation of the present invention.

In the operation of the clock signal generation circuit 100, the global PLL 110 receives a reference clock signal CKREF to generate a synchronization clock signal CKSYNC, wherein the synchronization clock signal CKSYNC has a higher frequency, such as 200 MHz-400 MHz. Then, the local PLL 120_1 receives the synchronization clock signal CKSYNC, and uses the synchronization clock signal CKSYNC as a reference clock signal to generate a first clock signal CK_DQ_S0. The phase adjustment circuits 130_1-130_9 adjust the phase of the first clock signal CK_DQ_S0 to generate a first group of output clock signals CK_DQ0-CK_DQ7 and CK_DQS respectively, wherein the output clock signals CK_DQ0-CK_DQ7 are used for the transmission of the 1st to 8th bits in the data signal, respectively, and the output clock signal CK_DQS is used to generate the data strobe signal. Similarly, the local PLL 120_2 receives the synchronization clock signal CKSYNC, and uses the synchronization clock signal CKSYNC as a reference clock signal to generate a second clock signal CK_DQ_S1. The phase adjustment circuits 140_1-140_8 adjust the phase of the second clock signal CK_DQ_S1 to generate a second group of output clock signals CK_DQ8-CK_DQ15, respectively, wherein the output clock signals CK_DQ8-CK_DQ15 are used for the transmission of the 9th to 16th bits in the data signal, respectively. The local PLL 120_3 receives the synchronization clock signal CKSYNC, and uses the synchronization clock signal CKSYNC as a reference clock signal to generate a third clock signal CK_DQ_S2. The phase adjustment circuits 150_1-150_8 adjust the phase of the third clock signal CK_DQ_S2 to generate a third group of output clock signals CK_DQ16-CK_DQ23, respectively, wherein the output clock signals CK_DQ16-CK_DQ23 are used for the transmission of the 17th to 24th bits in the data signal, respectively. The local PLL 120_4 receives the synchronization clock signal CKSYNC, and uses the synchronization clock signal CKSYNC as a reference clock signal to generate a fourth clock signal CK_DQ_S3. The phase adjustment circuits 160_1-160_8 adjust the phase of the fourth clock signal CK_DQ_S3 to generate a fourth group of output clock signals CK_DQ24-CK_DQ31, respectively, wherein the output clock signals CK_DQ24-CK_DQ31 are used for the transmission of the 25th to 32nd bits in the data signal, respectively. The local PLL 120_5 receives the synchronization clock signal CKSYNC, and uses the synchronization clock signal CKSYNC as a reference clock signal to generate a fifth clock signal CK_CMD. The phase adjustment circuits 170_1 and 170_2 adjust the phase of the fifth clock signal CK_CMD to generate the fifth group of output clock signals CK_DDR and CK_ADD, respectively, wherein the output clock signals CK_DDR and CK_ADD are used to generate the double data rate clock signal and the address signal. The fifth group of clock signals may additionally include clock signals CK_CMD, CK_RX, and CK_MC which are used to generate command signals and internal required clock signals.

In the clock signal generation circuit 100 shown in FIG. 1, by using the high-frequency synchronization clock signal CKSYNC generated by the global PLL 110 as the reference clock signal, the local PLLs 120_1-120_5 can have larger bandwidth with short locking time, so it can quickly switch to different frequencies by changing the divisor of a frequency divider within the local PLL 120_1-120_5. In addition, since the local PLLs 120_1-120_5 respectively generate the first to fifth groups of clock signals for different signals, the local PLLs 120_1-120_5 can be respectively disposed near the corresponding pads/pins. For example, the local PLL 120_1 can be positioned near the pads for transmitting the 1st to 8th bits (i.e., DQ0-DQ7) in the data signal, and the local PLL 120_2 can be positioned near the pads for transmitting the 9th to 16th bits (i.e., DQ8-DQ15) in the data signal, to greatly reduce the length of the clock tree on the circuit layout, so as to reduce the clock jitter clock jitter introduced by the long clock tree length.

It should be noted that, in the embodiment of FIG. 1, it is assumed that the data signal transmitted by the DRAM controller is 32 bits, and a clock signal output by each of the four local PLLs 120_1-120_4 is used to generate the output clock signals for transmitting the 8-bit data signal, however, this is not a limitation of the present invention. In other embodiments, the data signal transmitted by the DRAM controller is not limited to 32 bits, and the number of local PLLs for generating clock signals is not limited to four, and a number of output clock signals generated by the phase adjustment circuits can also be changed according to the number of bits of the data signal, and the number of phase adjustment circuits corresponding to each local PLL is not limited to that shown in FIG. 1.

Figure 2:
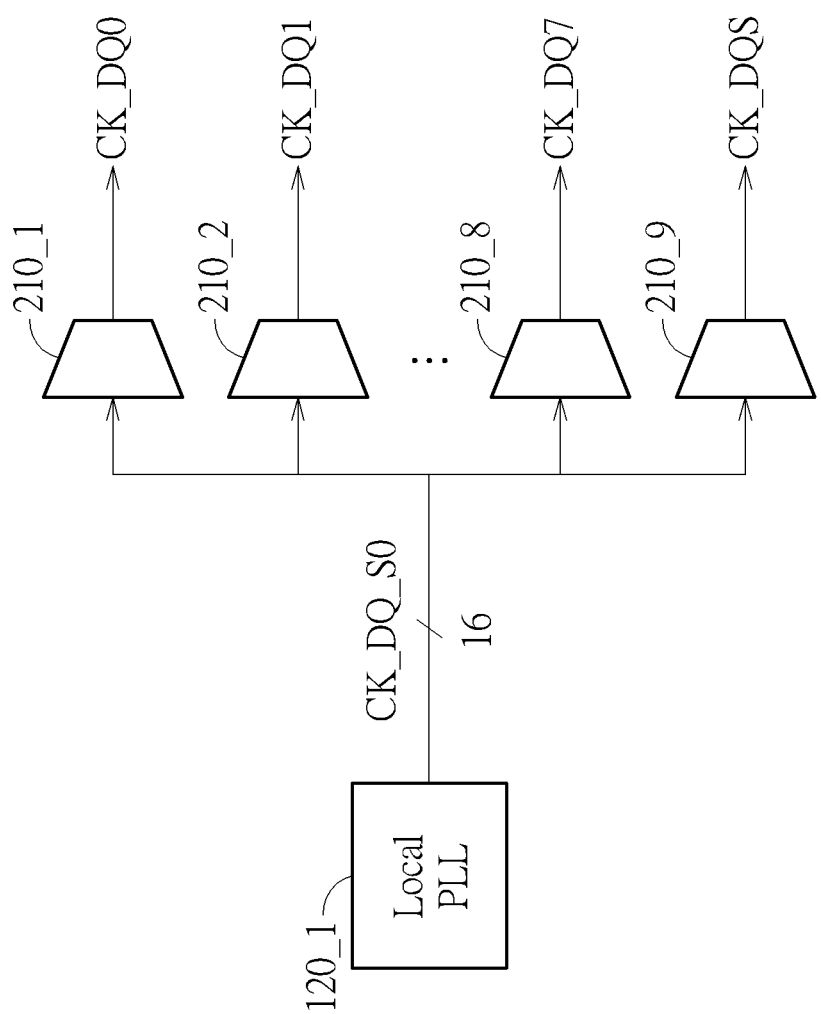
FIG. 2 is a diagram of using multiplexers within the clock signal generation circuit to generate a plurality of clock signals according to one embodiment of the present invention.

In the embodiment shown in FIG. 1, the required clock signal is generated by the plurality of phase adjustment circuits 130_1-130_9, 140_1-140_8, 150_1-150_8, 160_1-160_8, 170_1 and 170_2, however, the present invention is not limited to this. In other embodiments, each of the local PLLs 120_1-120_5 can generate a plurality of clock signals with different phases, and the phase adjustment circuits in FIG. 1 can be replaced with multiplexers to select the desired clock signal. Specifically, referring to FIG. 2, the local PLL 120_1 generates clock signals CK_DQ_S0 with 16 different phases, and the multiplexer 210_1 receives the clock signals CK_DQ_S0 with 16 different phases and selects one of them as the output clock signal CK_DQ0, the multiplexer 210_2 receives the clock signals CK_DQ_S0 with 16 different phases and selects one of them as the output clock signal CK_DQ1, . . . , the multiplexer 210_8 receives the clock signals CK_DQ_S0 with 16 different phases and selects one of them as the output clock signal CK_DQ7, and the multiplexer 210_9 receives the clock signals CK_DQ_S0 with 16 different phases and selects one of them as the output clock signal CK_DQS.

Figure 3:
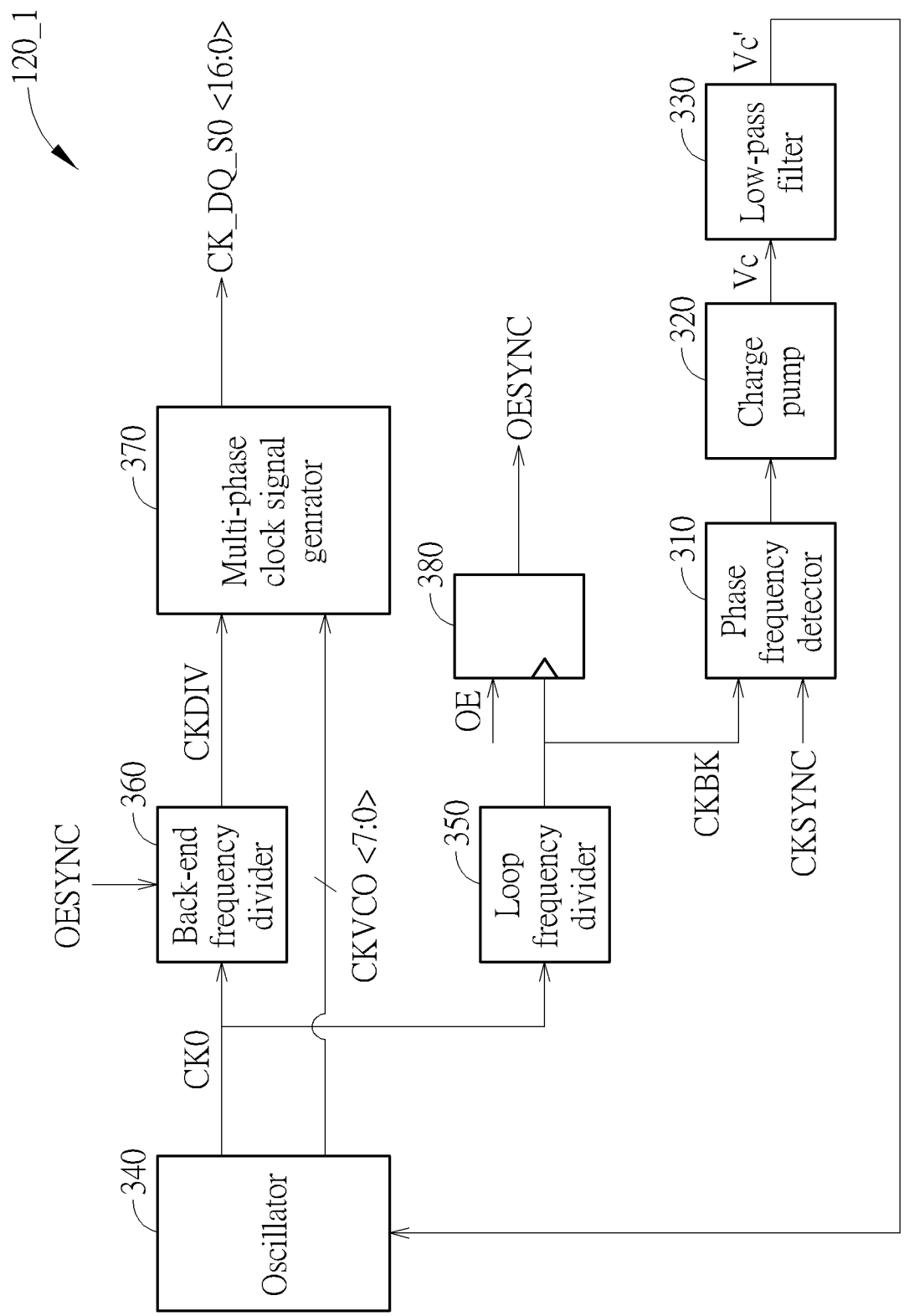
FIG. 3 is a diagram illustrating a local PLL according to one embodiment of the present invention.

FIG. 3 is a diagram illustrating the local PLL 120_1 according to one embodiment of the present invention. As shown in FIG. 1, the local PLL 120_1 comprises a phase frequency detector 310, a charge pump 320, a low-pass filter 330, an oscillator 340, a loop frequency divider 350, a back-end frequency divider 360, a multi-phase clock signal generator 370 and a sampling circuit (in this embodiment, a flip-flop 380 serves as the sampling circuit). In this embodiment, the phase frequency detector 310 generates a detection result according to the synchronization clock signal CKSYNC and a feedback clock signal CKBK, the charge pump 320 generates a control signal Vc according to the detection result, and the low-pass filter 330 filters the control signal Vc to generate a filtered control signal Vc' to control the oscillator 340 to generate a plurality of oscillator output clock signals (hereinafter referred to as clock signals CK0 and CKVCO<7:0>). The operations of the phase frequency detector 310, the charge pump 320, the low-pass filter 330 and the oscillator 340 are well known to those skilled in the art, so the details are omitted here.

Figure 4:
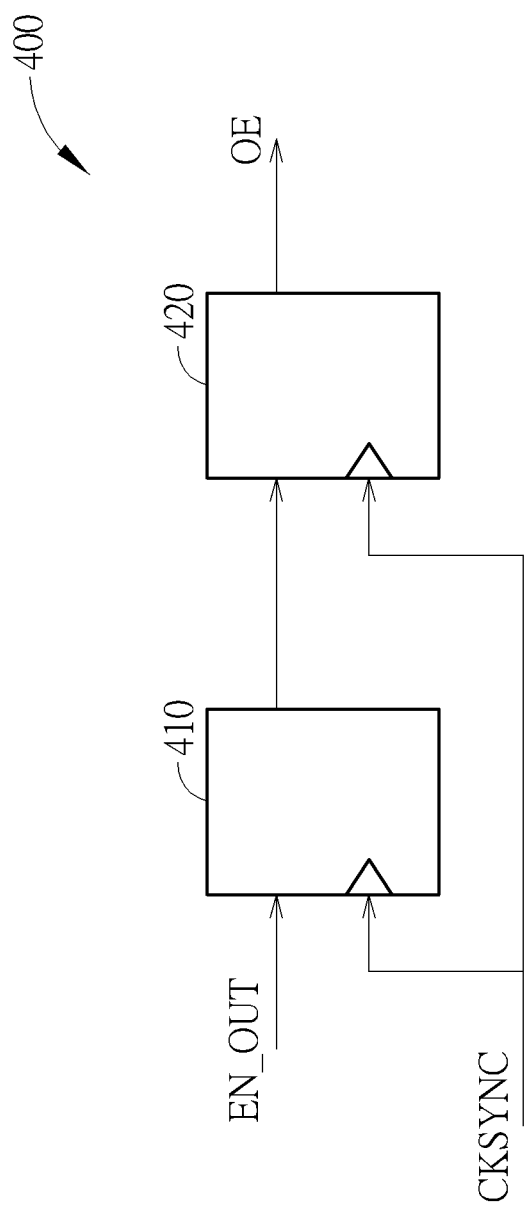
FIG. 4 is a diagram illustrating an output enable signal generation circuit according to one embodiment of the present invention.

Then, the loop frequency divider 350 performs a frequency dividing operation on the clock signal CK0 to generate the feedback clock signal CKBK, wherein the divisor of the loop divider 350 is adjustable. The flip-flop 380 receives an output enable signal OE, and is triggered by the feedback clock signal CKBK to generate an output enable synchronization signal OESYNC, wherein the output enable synchronization signal OESYNC is used to control whether the back-end frequency divider 360 can output a frequency-divided signal. For example, when the output enable synchronization signal OESYNC has a logic value "1", the back-end frequency divider 360 performs a frequency dividing operation on the clock signal CK0 to generate a frequency-divided clock signal CKDIV; and when the output enable synchronization signal OESYNC has a logic value "0", the back-end frequency divider 360 does not output the frequency-divided clock signal CKDIV. In one embodiment, the output enable signal OE is generated by an output enable signal generation circuit 400 shown in FIG. 4. In FIG. 4, the output enable signal generation circuit 400 comprises two sampling circuits (in this embodiment, the flip-flops 410 and 420 serve as the two sampling circuits), wherein the flip-flop 410 samples an enable signal EN_OUT according to the synchronization clock signal CKSYNC, and the flip-flop 420 samples an output signal of the flip-flop 410 according to the synchronization clock signal CKSYNC to generate the output enable signal OE. It is noted that the circuit structure and the number of flip-flops shown in FIG. 4 are only illustrative, not limitations of the present invention. As long as the output enable signal generation circuit 400 uses the synchronization clock signal CKSYNC to generate the output enable signal OE, so that the synchronization clock signal CKSYNC and the output enable signal OE have a fixed phase relationship (e.g., the phases are aligned), the output enable signal generation circuit 400 can have different circuit designs.

Regarding the back-end frequency divider 360 and the multi-phase clock signal generator 370, when the back-end frequency divider 360 refers to the output enable synchronization signal OESYNC to start the frequency dividing operation on the clock signal CK0 to generate the frequency-divided clock signal CKDIV, the multi-phase clock generator 370 can use the clock signals CKVCO<7:0> to sample the frequency-divided clock signal CKDIV to generate a plurality of clock signals CK_DQ_S0 with different phases, for example, sixteen clock signals CK_DQ_S0<16:0> with different phases. For example, the frequency of the frequency-divided clock signal CKDIV may be half of the frequency of the clock signals CKVCO<7:0>, and the multi-phase clock generator 370 may include 16 sampling circuits for using each of the clock signals CKVCO<7:0> to perform two sampling operations on the frequency-divided clock signal CKDIV to generate 16 clock signals CK_DQ_S0<16:0> with different phases.

In the embodiment of FIG. 3, the output enable signal OE is the input signal of the local PLL 120_1, and is used to control whether the local PLL 120_1 outputs sixteen clock signals CK_DQ_S0<16:0> with different phases, and the flip-flop 380 uses the feedback clock signal CKBK to sample the output enable signal OE to generate the output enable synchronization signal OESYNC, so as to control the time when the back-end frequency divider 360 outputs the frequency-divided clock signal CKDIV. Therefore, because the feedback clock signal CKBK and the clock signal CK0 output by the oscillator 340 have a fixed phase relationship, the output enable synchronization signal OESYNC and the clock signal CK0 also have a fixed phase relationship, so the following enabling time and disabling time of the back-end frequency divider 360 can be precisely controlled by the output enable signal OE, so that the situation that the back-end frequency divider 360 outputs the frequency-divided clock signal CKDIV too early or too late will not occur.

In one embodiment, each of the local PLLs 120_2-120_5 may have a circuit structure similar to that of the local PLL 120_1 shown in FIG. 3, and the output enable signals OE received by the local PLLs 120_1-120_5 are generated by the same circuit such as the output enable signal generation circuit 400, to ensure the correctness of the timing of the clock signals output by the clock signal generation circuit 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock signal generation circuit, comprising:
a global phase-locked loop (PLL), configured to receives a reference clock signal to generate a synchronization clock signal; and
a plurality of local PLLs, wherein the plurality of local PLLs receive the synchronization clock signal to generate a plurality of clock signals, respectively, and the plurality of clock signals are used to generate a plurality of output clock signals;
wherein the plurality of local PLLs comprise at least a first local PLL and a second local PLL, the first local PLL is configured to receive the synchronization clock signal to generate at least one first clock signal for generating a plurality of first output clock signals; and the second local PLL receives the synchronization clock signal to generate at least one second clock signal for generating a plurality of second output clock signals;
wherein the clock signal generation circuit further comprises
a plurality of first phase adjustment circuits, configured to adjust phase(s) of the at least one first clock signal to generate the plurality of first output clock signals, respectively; and
a plurality of second phase adjustment circuits, configured to adjust phase(s) of the at least one second clock signal to generate the plurality of second output clock signals, respectively.

2. The clock signal generation circuit of claim 1, wherein the clock signal generation circuit is within a dynamic random access memory (DRAM), the plurality of first output clock signal are used for transmission of a first portion of bits of a data signal (DQ), and the plurality of second output clock signals are used for transmission of a second portion of bits of the data signal.

3. The clock signal generation circuit of claim 1, wherein the plurality of local PLLs receive a same output enable signal to synchronize the plurality of output clock signals.

4. The clock signal generation circuit of claim 1, wherein the plurality of local PLLs comprise the first local PLL, and the first local PLL comprises:
a phase frequency detector, configured to receive the synchronization clock signal and a feedback clock signal to generate a detection result;
a charge pump, coupled to the phase frequency detector, configured to generate a control signal according to the detection result;
a low-pass filter, coupled to the charge pump, configured to filter the control signal to generate a filtered control signal;
an oscillator, coupled to the low-pass filter, configured to generate an oscillator output clock signal according to the filtered control signal;
a loop frequency divider, configured to perform a frequency dividing operation on the oscillator output clock signal to generate the feedback clock signal; and
a back-end frequency divider, coupled to the oscillator, configured to perform the frequency dividing operation on the oscillator output clock signal to generate at least one of the plurality of clock signals.

5. A clock signal generation circuit, comprising:
a global phase-locked loop (PLL), configured to receives a reference clock signal to generate a synchronization clock signal; and
a plurality of local PLLs, wherein the plurality of local PLLs receive the synchronization clock signal to generate a plurality of clock signals, respectively, and the plurality of clock signals are used to generate a plurality of output clock signals;
wherein the plurality of local PLLs comprise at least a first local PLL and a second local PLL, the first local PLL is configured to receive the synchronization clock signal to generate at least one first clock signal for generating a plurality of first output clock signals; and the second local PLL receives the synchronization clock signal to generate at least one second clock signal for generating a plurality of second output clock signals;
wherein the first local PLL is configured to receive the synchronization clock signal to generate a plurality of first clock signals, and the second local PLL receives the synchronization clock signal to generate a plurality of second clock signals, and the clock signal generation circuit further comprises:

a plurality of first multiplexers, wherein each of the plurality of first multiplexers receives the plurality of first clock signals, and selects one of the plurality of first clock signals to output one of the plurality of first output clock signals; and a plurality of second multiplexers, wherein each of the plurality of second multiplexers receives the plurality of second clock signals, and selects one of the plurality of second clock signals to output one of the plurality of second output clock signals.

6. A clock signal generation circuit, comprising:

a global phase-locked loop (PLL), configured to receives a reference clock signal to generate a synchronization clock signal; and a plurality of local PLLs, wherein the plurality of local PLLs receive the synchronization clock signal to generate a plurality of clock signals, respectively, and the plurality of clock signals are used to generate a plurality of output clock signals;

wherein the plurality of local PLLs comprise a first local PLL, and the first local PLL comprises:

a phase frequency detector, configured to receive the synchronization clock signal and a feedback clock signal to generate a detection result;

a charge pump, coupled to the phase frequency detector, configured to generate a control signal according to the detection result;

a low-pass filter, coupled to the charge pump, configured to filter the control signal to generate a filtered control signal;

an oscillator, coupled to the low-pass filter, configured to generate an oscillator output clock signal according to the filtered control signal;

a loop frequency divider, configured to perform a frequency dividing operation on the oscillator output clock signal to generate the feedback clock signal; and a back-end frequency divider, coupled to the oscillator, configured to perform the frequency dividing operation on the oscillator output clock signal to generate at least one of the plurality of clock signals;

wherein the first local PLL further comprises:

a sampling circuit, coupled to the loop frequency divider, configured to use the feedback clock signal to sample an output enable signal to generate an output enable synchronization signal;

wherein the back-end frequency divider determines whether to generate the at least one of the plurality of clock signals according to the output enable synchronization signal.

7. The clock signal generation circuit of claim 6, further comprising:

an output enable signal generation circuit, configured to use the synchronization clock signal to sample an enable signal to generate the output enable signal.

8. The clock signal generation circuit of claim 7, wherein the plurality of local PLLs receive the same output enable signal to synchronize the plurality of output clock signals.

* * * * *